United States Patent
Qin (10) Patent No.: US 8,618,825 B2
(45) Date of Patent: Dec. 31, 2013

(54) ARRAY SUBSTRATE, MANUFACTURING METHOD AND DETECTING METHOD THEREOF, AND LIQUID CRYSTAL PANEL

(75) Inventor: Wei Qin, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/308,758

(22) Filed: Dec. 1, 2011

(65) Prior Publication Data
US 2012/0138926 A1 Jun. 7, 2012

(30) Foreign Application Priority Data
Dec. 3, 2010 (CN) .......................... 2010 1 0579427

(51) Int. Cl.
*G01R 31/26* (2006.01)
(52) U.S. Cl.
USPC .................. 324/760.01; 324/760.02; 257/59; 257/72; 257/E27.111; 438/149; 438/151
(58) Field of Classification Search
USPC .................. 324/760.01, 760.02; 257/59, 72, 257/E27.111; 438/149, 151
See application file for complete search history.

(56) References Cited

U.S. PATENT DOCUMENTS

| | | | | | |
|---|---|---|---|---|---|
| 6,310,590 | B1* | 10/2001 | Havel | .............................. | 345/83 |
| 7,223,642 | B2* | 5/2007 | Choi | .............................. | 438/151 |
| 7,830,484 | B2* | 11/2010 | Eom et al. | ..................... | 349/139 |
| 2008/0135846 | A1* | 6/2008 | Shin et al. | ........................ | 257/59 |
| 2009/0244429 | A1* | 10/2009 | Chung et al. | ..................... | 349/56 |
| 2009/0294771 | A1* | 12/2009 | Kim et al. | ....................... | 257/59 |
| 2012/0007628 | A1* | 1/2012 | Chiou | ...................... | 324/760.02 |

FOREIGN PATENT DOCUMENTS

CN 101813849 A 8/2010

OTHER PUBLICATIONS

First Chinese Office Action; dated May 29, 2013; Appln. No. 201010579427.3.

* cited by examiner

*Primary Examiner* — Tung X Nguyen
*Assistant Examiner* — Thang Le
(74) *Attorney, Agent, or Firm* — Ladas & Parry LLP (57) ABSTRACT

An embodiment of the present disclosure provides a method of manufacturing an array substrate, comprising at least a step of forming a TFT pattern in a pixel region and correspondingly forming a TFT testing pattern in a testing region, wherein before forming a passivation layer to cover the pixel region and the testing region, a step of removing a gate insulation layer thin film above a testing line lead in the TFT testing pattern.

2 Claims, 7 Drawing Sheets

ARRAY SUBSTRATE, MANUFACTURING METHOD AND DETECTING METHOD THEREOF, AND LIQUID CRYSTAL PANEL

BACKGROUND

Embodiments of the present disclosure relate to an array substrate, a manufacturing method and a detecting method thereof, and a liquid crystal panel.

Liquid crystal displays are currently commonly-used flat panel displays, and thin film transistor liquid crystal displays (TFT-LCDs) have become the main products among liquid crystal displays.

In the manufacturing process of TFT-LCDs, it is a relatively important step to perform inspection on the electrical characteristics of the thin film transistor (TFT) patterns. In the conventional technology, it is common to form a TFT test pattern especially for testing in a perpheral region of the base substrate, i.e., a testing region while forming the TFT patterns of a pixel region on the base substrate. The pattern size, film structure and process flow of the TFT testing pattern are completely the same as those of the TFT patterns of the pixel region. Thus, it can be known whether the electrical characteristics of the TFT patterns in the pixel region are qualified or not by inspecting on the TFT testing pattern of the testing region. The process of performing test on the TFT testing pattern is conducted as follows: changing the voltage of the gate line lead of the TFT testing pattern; testing the current change of the source and drain electrodes of the TFT testing pattern; obtaining the electrical characteristic curve of the TFT testing pattern; determining whether the electrical characteristic of the TFT testing pattern is normal when the TFT is turned on and switched off so as to determine whether the electrical characteristic of the TFT testing pattern of the pixel region is qualified or not.

In the conventional technology, the inspection on the electrical characteristic of the TFT pattern is performed after the manufacturing process of the array substrate is completed, i.e., after the pixel electrode has been formed on the base substrate. A testing probe is inserted to make contact with the gate line lead on the underlying layer by the via hole formed above the gate line lead of the TFT testing pattern, so as to inspect the electrical characteristics of the TFT patterns of the pixel region. However, the manufacturing period of the array substrate generally lasts for three to five days, so there is a time hysteresis for performing the inspection of electrical characteristics in the conventional technology. Thus, it is impossible to detect timely and obtain the electrical characteristics of the TFT patterns of the pixel region, so that it is impossible to perform adjustment to the processes and equipments in the production line timely.

SUMMARY

Embodiments of the present disclosure provides an array substrate, a manufacturing method and a detecting method thereof, and a liquid crystal panel, enabling to inspect timely and obtain the electrical characteristic of the TFT patterns of the pixel region.

An embodiment of the present disclosure provides a method of manufacturing an array substrate, comprising at least a step of forming a TFT pattern in a pixel region and correspondingly forming a TFT testing pattern in a testing region, wherein before forming a passivation layer to cover the pixel region and the testing region, a step of removing a gate insulation layer thin film above a testing line lead in the TFT testing pattern.

Another embodiment of the present disclosure provides an array substrate, comprising a pixel region and a testing region, wherein the pixel region comprises gate lines, data lines and pixel units defined by intersecting between the gate lines and the data lines, and the gate lines and the date lines are provided on different layers, the testing region comprises a testing line lead corresponding to the gate lines or the data lines which are on a lower layers, and the pixel region and the testing region are covered by a passivation layer, and wherein no gate insulation layer is retained between the upper portion of the testing line lead of the testing region and the upper passivation layer.

Further another embodiment of the present disclosure provides a liquid crystal panel, which comprises a color filter substrate and an array substrate cell assembled together, with a liquid crystal layer filled therebetween, wherein the array substrate adopts the structure of the above described array substrate.

Still further an embodiment of the present disclosure provides a method of detecting an array substrate, in which the detecting process is performed on the electrical characteristic of the TFT testing pattern after forming the TFT testing channel and removing the gate insulation layer thin film above the testing line lead in the TFT testing pattern of the testing region.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The embodiments of the present disclosure will become more fully understood from the detailed description given hereinafter and the accompanying drawings which are given by way of illustration only, and thus are not limitative of the present disclosure and wherein.

DETAILED DESCRIPTION

Solutions of the embodiments of the present disclosure will be described clearly and completely hereafter with accompany of the attached drawings in order to make the objection, technical solution and advantage of the embodiments of the present disclosure more clear. It is obvious that only some of the embodiments, not all of the embodiments, are described. Based on the embodiments of the present disclosure, all other embodiments obtained by those skilled in the art without any inventive labor are intended to be included within the scope of the present disclosure defined by the claims.

In the conventional technology, the process procedure of manufacturing the array substrate with bottom-gate structure and detecting the electric characteristic of the TFT pattern is as follows: forming gate metal line firstly; then forming a silicon island and source/drain metal lines and TFT channel; then forming passivation layer and the passivation layer via hole; finally forming transparent electrode. After completing the above steps, that is, after completing the manufacturing process of the array substrate, performing test to the electric characteristic of the formed TFT pattern. Actually, during the process of manufacturing the array substrate, after forming the TFT channel, TFT has already been formed, and the subsequential procedure of forming the passivation layer, the insulation passivation layer via hole and transparent electrode is to fulfill the connection of the drain and the transparent electrode. Thus, the electric characteristic test of the TFT pattern may be performed after forming the TFT channel and before forming the passivation layer. However, in the conventional process, the gate insulation layer is covered on the gate line lead in the TFT testing pattern of the testing region. Thus, when performing test by the test probe, it is easy to cause bad contact with the gate line lead. As to the top-gate structure, the gate insulation layer thin film is covered on the data line lead in the TFT testing pattern of the testing region. Thus, before forming passivation layer, the embodiment of the present disclosure may further comprise the step of removing the gate insulation layer thin film above the testing line lead in the TFT testing pattern.

In the embodiment, if the TFT structure adopts the bottom-gate structure, the gate line is provided under the active layer and source and drain electrodes in a TFT, the step of removing the gate insulation layer thin film above the testing line lead in the TFT testing pattern before forming a passivation layer may include a step of removing the gate insulation layer thin film that covers above the testing line lead in the test region before forming TFT channel. If the TFT structure adopts the top-gate structure, the gate line is provided above the active layer and source and drain electrodes in a TFT, the step of removing the gate insulation layer thin film above the testing line lead in the TFT testing pattern before forming the passivation layer may include a step of removing the gate insulation layer thin film that covers above the data line lead in the test region after forming the TFT channel and before forming the passivation layer.

The step of removing the gate insulation layer thin film above the testing line lead in the TFT testing pattern may be implemented by adopting a lifting off process to remove the gate insulation layer thin film above the testing line lead by using the height difference of photoresist.

The embodiment of the present disclosure may remove the gate insulation layer thin film above the testing line lead during any process before forming the passivation layer, so as to, after removing the gate insulation layer thin film above the testing line lead in the TFT testing pattern in the bottom-gate structure or removing the gate insulation layer thin film above the data line lead in the TFT testing pattern in the top-gate structure, detection can be performed with respect to the electric characteristic of the TFT testing pattern. After completing the detection, the following manufacturing processes are then performed to complete the manufacturing of the array substrate.

Therefore, the embodiment of the present disclosure performs detection on the electric characteristic of the TFT testing pattern during the manufacturing process of the array substrate instead of performing test on the electric characteristic of the TFT testing pattern until accomplishing the manufacturing of the array substrate, so that it is possible to detect the TFT testing pattern of the testing region, obtain the electric characteristic of the TFT pattern of the pixel region timely, and thus make a potential adjustment to the processes and equipments of the manufacturing line timely.

It should be noted that, the embodiment of the present disclosure does not need to define the detailed manufacturing process for forming the above described top-gate structure TFT structure or bottom-gate structured TFT structure. Those skilled in the art may remove the gate insulation thin film above the gate line lead in the TFT testing pattern before forming the passivation layer during the process for forming the above described TFT structure by, for example, using three-time mask process, four-time mask process or five-time mask process.

The manufacturing method of the array substrate of the embodiment of the present disclosure by using four times mask processes will be explained in detail below. It should to be noted that, the manufacturing process of the TFT of the pixel region corresponds to the manufacturing process of the TFT testing pattern of testing region. Thus, in the following four-time mask process, the present embodiment merely describes the manufacturing process of the TFT testing pattern and takes the bottom-gated structure as an example for an explanation purpose.

The flow of the embodiment of the manufacturing method of the array substrate of the present disclosure may comprise the following steps.

Step 101: forming the gate metal thin film on the pixel region and testing region of the array substrate, coating photoresist on the gate metal thin film, and performing exposure and developing on the photoresist by using a double-tone mask plate, so as to forming a photoresist pattern comprising a first thickness region, a second thickness region and a completely removing region.

The photoresist pattern of the first thickness region is above the position of the gate line of the pixel region and above the position of the gate line of the testing region. The photoresist pattern of the second thickness region is positioned above the gate line lead of the pixel region and the gate line lead of the testing region, and the first thickness is smaller than the second thickness.

Figure 1:
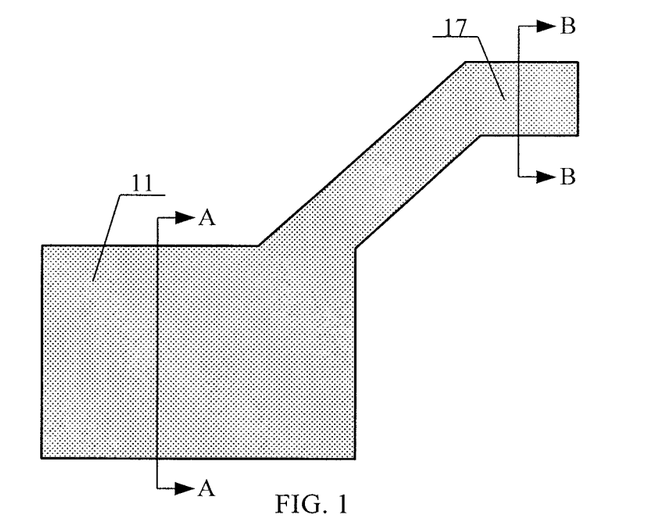
FIG. 1 is a schematic structural diagram of the TFT testing pattern after a first photolithography process in the manufacturing method of an array substrate provided by an embodiment of the present disclosure.
Figure 2:
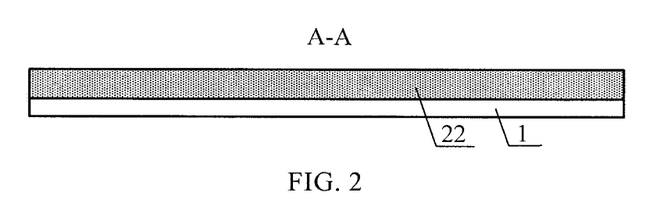
FIG. 2 is a sectional structural diagram along the line A-A in FIG. 1 after forming the gate metal thin film in the manufacturing method of an array substrate provided by an embodiment of the present disclosure.
Figure 3:
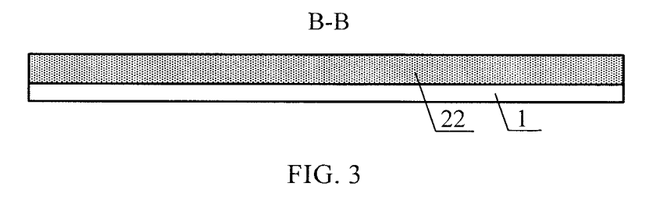
FIG. 3 is a sectional structural diagram along the line B-B in FIG. 1 after foiming the gate metal thin film in the manufacturing method of an array substrate provided by a embodiment of the present disclosure.
Figure 4:
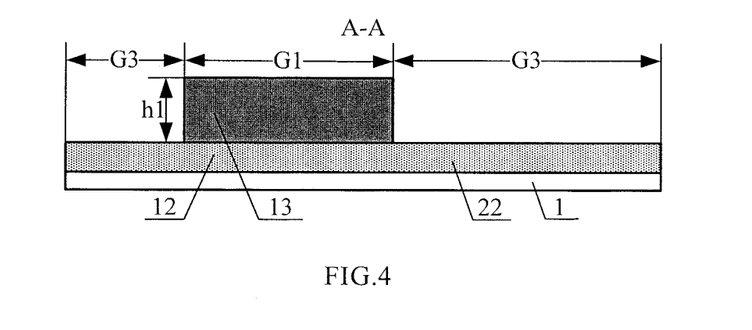
FIG. 4 is a sectional structural diagram along the line A-A in FIG. 1 after performing exposure and development on photoresist coated on the gate metal thin film in the manufacturing method of an array substrate provided by an embodiment of the present disclosure.
Figure 5:
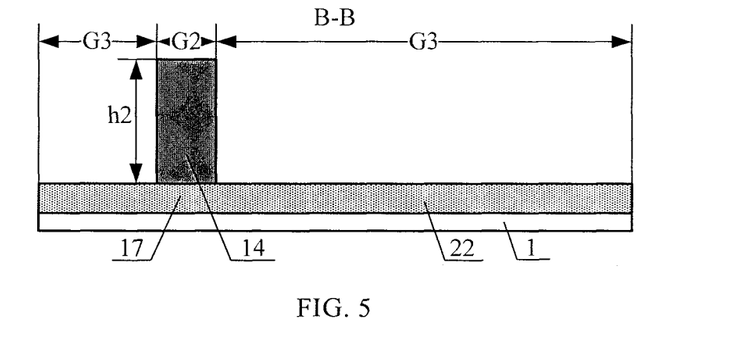
FIG. 5 is a sectional structural diagram along the line B-B in FIG. 1 after perfoiming exposure and development on the photoresist coated on the gate metal thin film in the manufacturing method of an array substrate provided by an embodiment of the present disclosure.

FIG. 1 is a schematic structural diagram of the TFT testing pattern after the first photolithography process in the manufacturing method of an array substrate provided by the embodiment of the present disclosure; FIG. 2 is a sectional structural diagram along the line A-A in FIG. 1 after forming the gate metal thin film in the manufacturing method of an array substrate provided by the embodiment of the present disclosure; FIG. 3 is a sectional structural diagram along the line B-B in FIG. 1 after forming the gate metal thin film in the manufacturing method of an array substrate provided by the embodiment of the present disclosure; FIG. 4 is a sectional structural diagram along the line A-A in FIG. 1 after performing exposure and development on the photoresist coated on the gate metal thin film in the manufacturing method of an array substrate provided by the embodiment of the present disclosure; FIG. 5 is a sectional structural diagram along the line B-B in FIG. 1 after performing exposure and development on the photoresist coated on the gate metal thin film in the manufacturing method of an array substrate provided by the embodiment of the present disclosure. As shown in FIGS. 2-6, the present embodiment may deposit a gate metal thin film 22 with a thickness of 500 Å~4000 Å on the base substrate 1 by using sputtering or heat evaporation method. The material of the gate metal thin film 22 may be chosen from metals such as Cr, W, Ti, Ta, Mo, Al, Cu and so on, alloy thereof, or a gate metal layer consisted of a plurality of metal layers.

Photoresist is coated on the gate metal thin film 22, and exposure and developing are performed by using a double-tone mask plate, for example a gray-tone mask plate, so as to form a photoresist pattern comprising a first thickness region G1, a second thickness region G2 and a completely removing region G3. The photoresist pattern 13 of the first thickness region G1 is positioned above the gate line region of the pixel region and the gate line region 12 of the testing region, the photoresist pattern 14 of the second thickness region G2 is positioned above the gate line lead of the pixel region and the gate line lead 17 of the testing region, and the first thickness h1 is smaller than the second thickness h2.

Step 102: perfoiming a first etching, so as to etch away the gate metal thin film corresponding to the completely removing region; forming a pattern comprising a gate line and a gate line lead in the pixel region; forming a pattern comprising a gate line and a gate line lead in the testing region; and removing the photoresist according to the first thickness.

Figure 6:
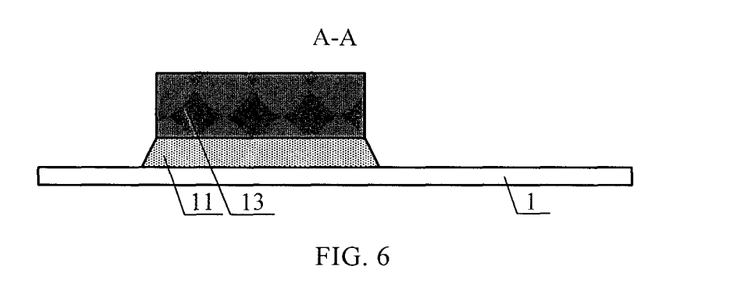
FIG. 6 is a sectional structural diagram after performing etching on the pattern shown in FIG. 4 in the manufacturing method of an array substrate provided by an embodiment of the present disclosure.
Figure 7:
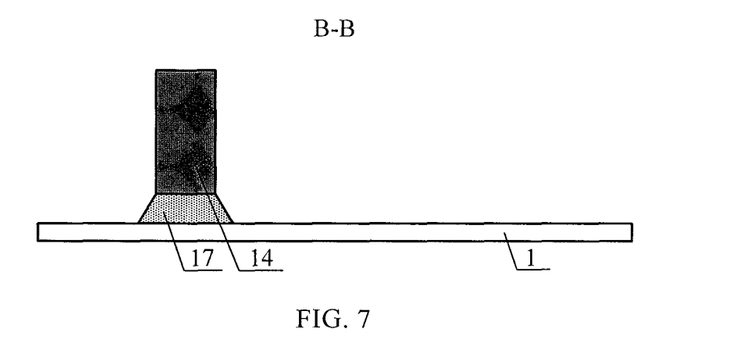
FIG. 7 is a sectional structural diagram after performing etching on the pattern shown in FIG. 5 in the manufacturing method of an array substrate provided by an embodiment of the present disclosure.
Figure 8:
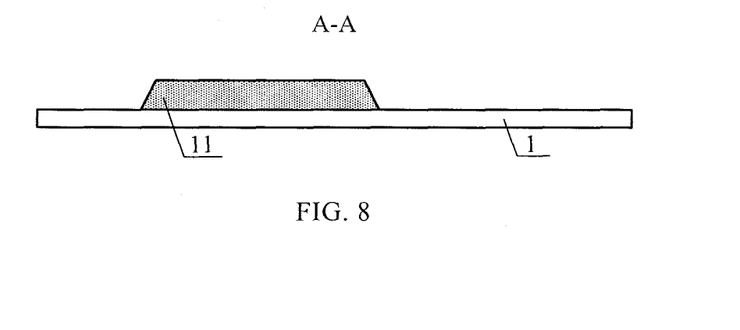
FIG. 8 is a sectional structural diagram after performing ashing of the photoresist on the pattern shown in FIG. 6 in the manufacturing method of an array substrate provided by an embodiment of the present disclosure.
Figure 9:
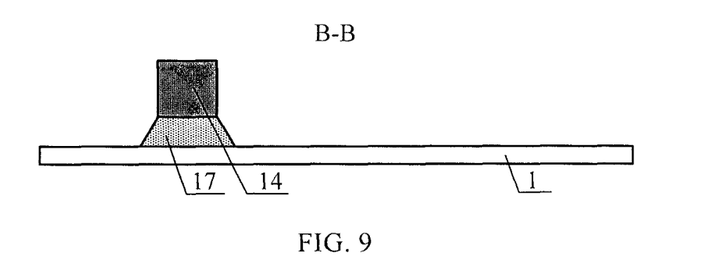
FIG. 9 is a sectional structural diagram after perfoiming ashing of the photoresist on the pattern shown in FIG. 7 in the manufacturing method of an array substrate provided by an embodiment of the present disclosure.

FIG. 6 is a sectional structural diagram after performing etching on the pattern shown in FIG. 4 in the manufacturing method of an array substrate provided by the embodiment of the present disclosure; FIG. 7 is a sectional structural diagram after performing etching on the pattern shown in FIG. 5 in the manufacturing method of an array substrate provided by the embodiment of the present disclosure; FIG. 8 is a sectional structural diagram after performing ashing of the photoresist on the pattern shown in FIG. 6 in the manufacturing method of an array substrate provided by the embodiment of the present disclosure; FIG. 9 is a sectional structural diagram after performing ashing of the photoresist on the pattern shown in FIG. 7 in the manufacturing method of an array substrate provided by the embodiment of the present disclosure. As shown in FIGS. 7-10, the first etching may etch the gate metal thin film 22 corresponding to the photoresist completely removing region G3 by using wet etching, so as to form a pattern comprising a gate line and a gate line lead at the position of the gate line of the pixel region, and form a pattern of the gate line 11 shown in FIG. 6 and a pattern of the gate line lead 17 shown in FIG. 7 in the testing region. After completing the first etching, the thinning of the photoresist may be performed under the atmosphere containing oxygen by using an ashing process. In particularly, the photoresist pattern 13 of the first thickness region G1 may be completely ashed by using the first thickness h1 of the photoresist in the first thickness region G1, and a portion of the photoresist pattern 14 of the second thickness region G2 is remained. The thickness of the remained photoresist pattern 14 is h2-h1. The remained photoresist pattern 14 does not have to be lifted off for the present.

Step 103: Sequentially depositing a gate insulation layer thin film, a semiconductor layer thin film, a doped semiconductor layer thin film and a source/drain metal thin film on the pixel region and testing region of the base substrate formed with the above pattern, and lifting off the photoresist above the gate line lead of the pixel region and above the gate line lead of the test region.

Figure 10:
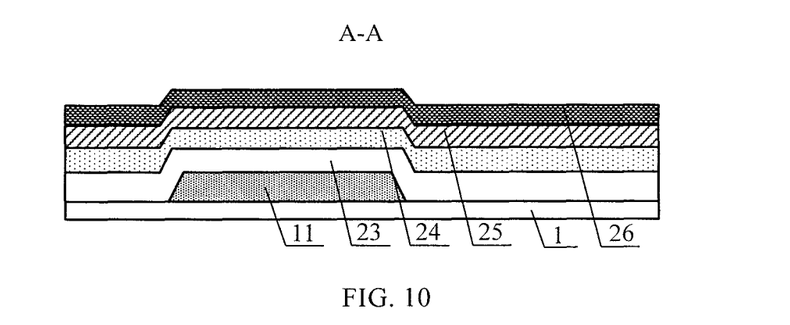
FIG. 10 is a sectional structural diagram along the line A-A in FIG. 1 after forming a gate insulation layer thin film, semiconductor layer thin film, doped semiconductor layer thin film and source/drain metal thin film in the manufacturing method of an array substrate provided by an embodiment of the present disclosure.
Figure 11:
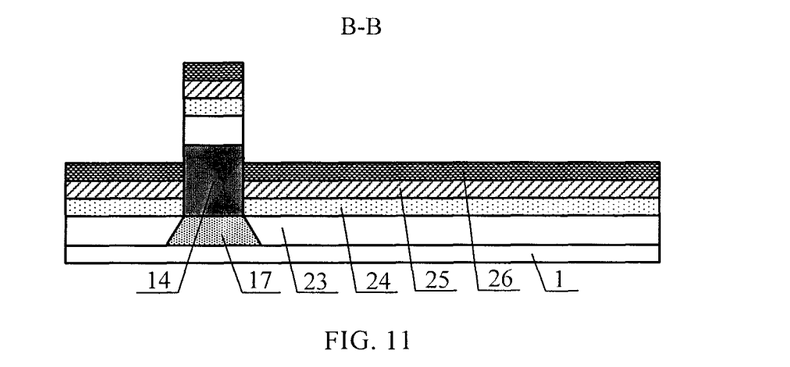
FIG. 11 is a sectional structural diagram along the line B-B in FIG. 1 after forming a gate insulation layer thin film, semiconductor layer thin film, doped semiconductor layer thin film and source/drain metal thin film in the manufacturing method of an array substrate provided by an embodiment of the present disclosure.
Figure 12:
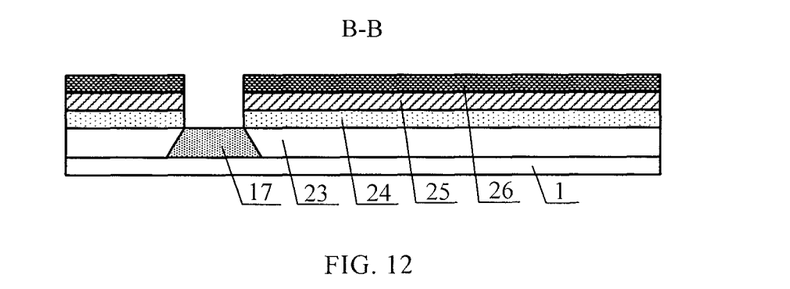
FIG. 12 is a structural diagram after lifting off the photoresist in FIG. 11 in the manufacturing method of an array substrate provided by an embodiment of the present disclosure.

FIG. 10 is a sectional structural diagram along the line A-A in FIG. 1 after forming a gate insulation layer thin film, a semiconductor layer thin film, a doped semiconductor layer thin film and a source/drain metal thin film in the manufacturing method of an array substrate provided by the embodiment of the present disclosure; FIG. 11 is a sectional structural diagram along the line B-B in FIG. 1 after forming the gate insulation layer thin film, the semiconductor layer thin film, the doped semiconductor layer thin film and the source/drain metal thin film in the manufacturing method of an array substrate provided by the embodiment of the present disclosure. As shown in FIGS. 11 and 12, a gate insulation layer thin film 23 with a thickness of 1000 Å~6000 Å, a semiconductor layer thin film 24 with a thickness of 1000 Å~6000 Å, and a doped semiconductor layer thin film 25 with a thickness of 200 Å~1000 Å may be sequentially deposited on the base substrate 1 by using Chemical Vapor Deposition method, then a source/drain metal thin film 26 with a thickness of 1000 Å~7000 Å is deposited by using magnetic sputtering or heat evaporation method.

FIG. 12 is a structural diagram after lifting off the photoresist in FIG. 11 in the manufacturing method of an array substrate provided by the embodiment of the present disclosure. As shown in FIG. 12, the photoresist pattern 14 is removed by lifting off process, so as to lift off the gate insulation layer thin film 23, the semiconductor layer thin film 24, the doped semiconductor layer thin film 25 and the source/drain metal thin film 26 above the gate line lead 17 as well. Correspondingly, a pattern corresponding to FIG. 12 is also formed in the pixel region, and the repeated description is omitted.

So far, the first photolithography process has finished in the present embodiment.

Step 104: coating a photoresist on the pixel region and the testing region of the base substrate formed with the above pattern, and performing exposure and developing to the photoresist by using a double-tone mask plate, so as to form a photoresist pattern comprising a third thickness region, a fourth thickness region and a completely removing region. The photoresist pattern of the third thickness region is positioned above the source/drain electrode region and the gate line lead of the pixel region, and above the source/drain electrode region and the gate line lead of the testing region. The photoresist pattern of the fourth thickness region is positioned above the channel region of the pixel region and the channel region of the testing region. The fourth thickness is smaller than the third thickness.

Figure 13:
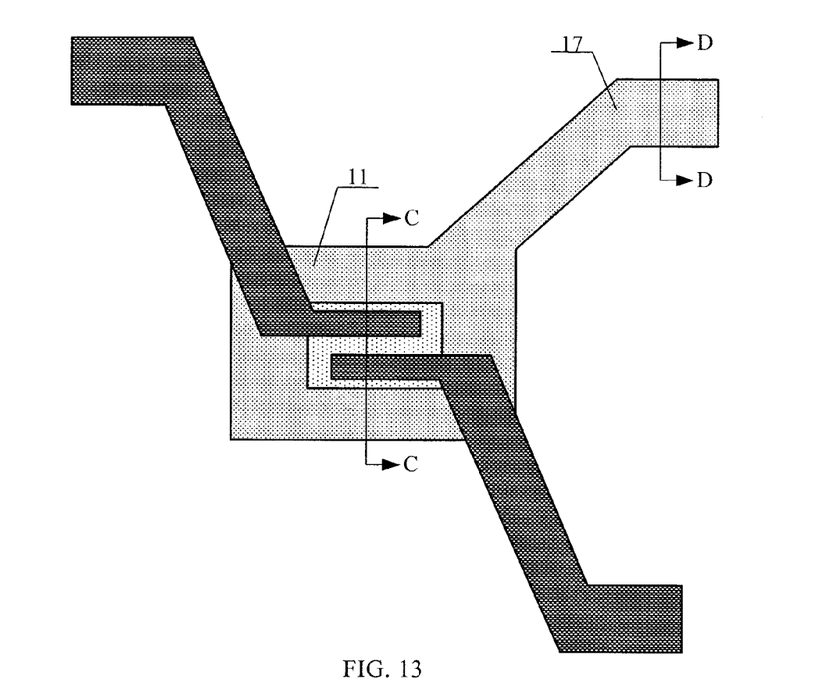
FIG. 13 is a structural diagram of the TFT testing pattern of the array substrate after performing the second photolithography in the manufacturing method of an array substrate provided by an embodiment of the present disclosure.
Figure 14:
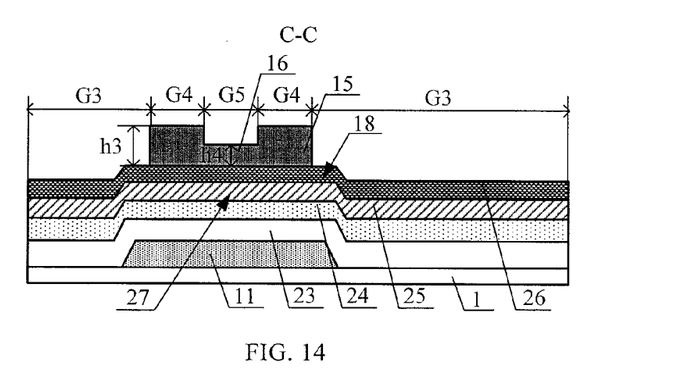
FIG. 14 is a sectional structural diagram along the line C-C in FIG. 13 after forming photoresist pattern on the source/drain metal thin film in the manufacturing method of an array substrate provided by an embodiment of the present disclosure.
Figure 15:
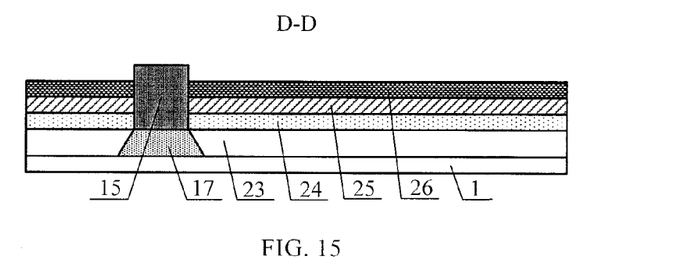
FIG. 15 is a sectional structural diagram along the line D-D in FIG. 13 after forming photoresist pattern on the source/drain metal thin film in the manufacturing method of an array substrate provided by an embodiment of the present disclosure.
Figure 16:
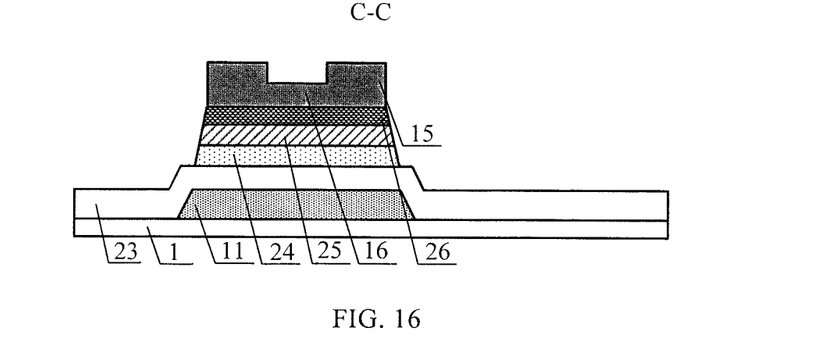
FIG. 16 is a sectional structural diagram along the line C-C in FIG. 13 after performing the second etching in the manufacturing method of an array substrate provided by an embodiment of the present disclosure.

FIG. 13 is a structural diagram of the TFT testing pattern of the array substrate after performing the second photolithography in the manufacturing method of an array substrate provided by the embodiment of the present disclosure; FIG. 14 is a sectional structural diagram along the line C-C in FIG. 13 after forming photoresist pattern on the source/drain metal thin film in the manufacturing method of an array substrate provided by the embodiment of the present disclosure; FIG. 15 is a sectional structural diagram along the line D-D in FIG. 13 after forming photoresist pattern on the source/drain metal thin film in the manufacturing method of an array substrate provided by the embodiment of the present disclosure. As shown in FIGS. 14-16, the photoresist is coated on the source/drain metal thin film 26, and the exposure and developing are performed by using a double-tone mask plate, for example a gray-tone mask plate, so as to form a photoresist pattern comprising the third thickness region G4, the fourth thickness region G5 and the completely removing region G3. The photoresist pattern 15 of the third thickness region G4 is positioned above the source/drain electrode region and the gate line lead of the pixel region, and above the source/drain electrode region 18 and the gate line lead 17 of the testing region. The photoresist pattern 16 of the fourth thickness region G5 is positioned above the TFT channel region of the pixel region and the channel region 27 of the testing region. The fourth thickness h4 is smaller than the third thickness h3.

Step 105: performing the second etching, to etch away the semiconductor layer thin film, the doped semiconductor layer thin film and a source/drain metal thin film corresponding to the completely removing region, and removing the photoresist according to the fourth thickness by ashing; performing the third etching to etch away the source/drain metal thin film, the doped semiconductor layer thin film and a portion of the semiconductor layer thin film in the channel region of the pixel region and the channel region of the testing region, to form the TFT channel of the pixel region and the TFT channel of the testing region; and lifting off the photoresist on the source/drain electrode of the pixel region, the photoresist on the source/drain electrode of the testing region, and the photoresist on the gate line lead.

Figure 17:
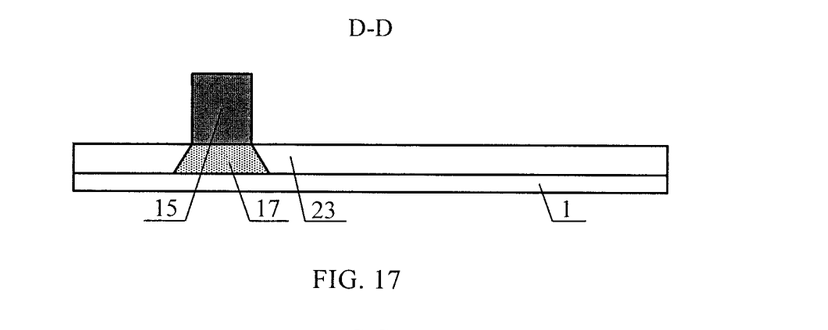
FIG. 17 is a sectional structural diagram along the line D-D in FIG. 13 after performing the second etching in the manufacturing method of an array substrate provided by an embodiment of the present disclosure.
Figure 18:
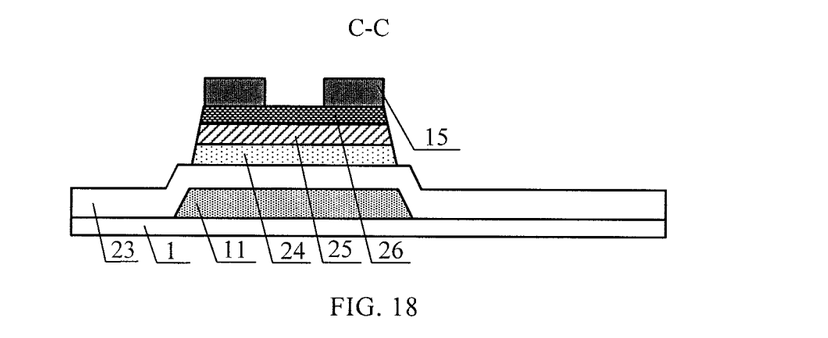
FIG. 18 is a sectional structural diagram after performing ashing of the photoresist to the pattern shown in FIG. 16 in the manufacturing method of an array substrate provided by an embodiment of the present disclosure.

FIG. 16 is a sectional structural diagram along the line C-C in FIG. 13 after performing the second etching in the manufacturing method of an array substrate provided by the embodiment of the present disclosure; and FIG. 17 is a sectional structural diagram along the line D-D in FIG. 13 after performing the second etching in the manufacturing method of an array substrate provided by the embodiment of the present disclosure. As shown in FIGS. 17 and 18, the second etching may firstly use wet etching, and then use dry etching, and the gate insulation layer thin film 23, the semiconductor layer thin film 24, the doped semiconductor layer thin film 25 and the source/drain metal thin film 26 corresponding to the completely removing region G3 are removed under the function of the ion bombardment and chemical reaction. Then, the photoresist is removed by ashing according to the four thickness h4 of the photoresist of the fourth thickness region G5.

Figure 19:
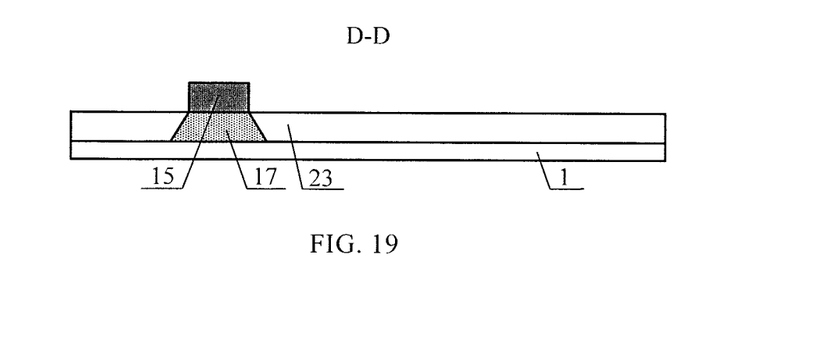
FIG. 19 is a sectional structural diagram after performing ashing of the photoresist to the pattern shown in FIG. 17 in the manufacturing method of an array substrate provided by an embodiment of the present disclosure.
Figure 20:
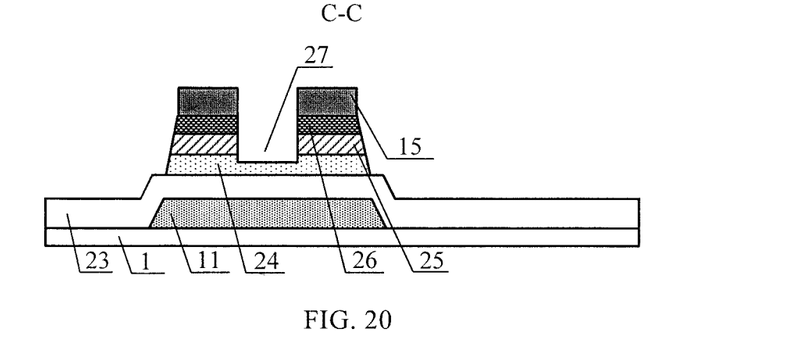
FIG. 20 is a sectional structural diagram along the line C-C in FIG. 13 after performing the third etching processing the manufacturing method of an array substrate provided by an embodiment of the present disclosure.

FIG. 18 is a sectional structural diagram after performing ashing of the photoresist to the pattern shown in FIG. 16 in the manufacturing method of an array substrate provided by the embodiment of the present disclosure, and FIG. 19 is a sectional structural diagram after performing ashing of the photoresist to the pattern shown in FIG. 17 in the manufacturing method of an array substrate provided by the embodiment of the present disclosure. As shown in FIGS. 19 and 20, the thinning of the photoresist is performed under the atmosphere containing oxygen, to completely ash the photoresist of the fourth thickness and remain the photoresist of the third thickness.

FIG. 20 is a sectional structural diagram along the line C-C in FIG. 13 after performing the third etching in the manufacturing method of an array substrate provided by the embodiment of the present disclosure. As shown in FIG. 20, the third etching may use dry etching, to etch away the source/drain metal thin film, the doped semiconductor layer thin film and a portion of the semiconductor layer thin film in the channel region of the pixel region, and etch away the source/drain metal thin film 26, the doped semiconductor layer thin film 25 and a portion of the semiconductor layer thin film 24 in the testing region, so as to form the TFT channel in the pixel region and form the TFT channel 27 in the testing region.

Figure 21:
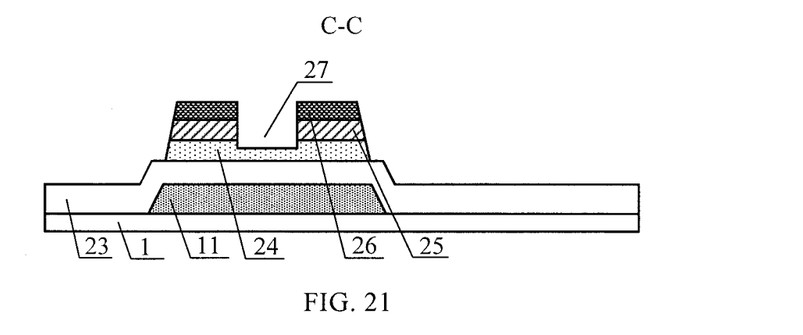
FIG. 21 is a sectional structural diagram after lifting off the photoresist of the pattern shown in FIG. 20 in the manufacturing method of an array substrate provided by an embodiment of the present disclosure.
Figure 22:
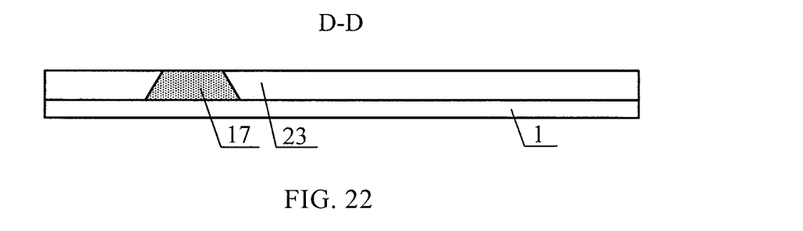
FIG. 22 is a sectional structural diagram after lifting off the photoresist of the pattern shown in FIG. 19 in the manufacturing method of an array substrate provided by an embodiment of the present disclosure.
Figure 23:
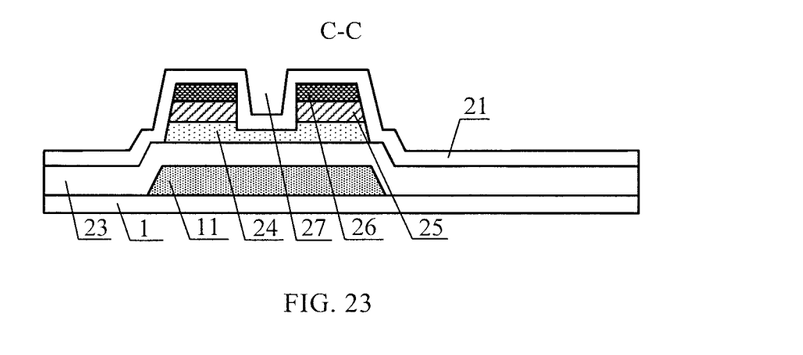
FIG. 23 is a sectional structural diagram after performing the fourth photolithography process to the TFT testing pattern shown in FIG. 21 in the manufacturing method of an array substrate provided by an embodiment of the present disclosure.

FIG. 21 is a sectional structural diagram after performing lifting off to the pattern shown in FIG. 20 in the manufacturing method of an array substrate provided by the embodiment of the present disclosure, and FIG. 22 is a sectional structural diagram after performing lifting off to the pattern shown in FIG. 19 in the manufacturing method of an array substrate provided by the embodiment of the present disclosure. As shown in FIGS. 21 and 23, the photoresist is removed by lifting off process, so that the gate line lead 17 is exposed to the surface of the base substrate 1.

So far, the second etching process is finished in the present embodiment, and TFT channels are formed both in the pixel region and the testing region. After forming the TFT channel, the gate line lead 17 of the testing region is not covered by the gate insulation layer thin film 23, but exposed on the surface of the base substrate 1. At this time, the detection may be performed on the electric characteristic of the TFT channel of the testing region. For example, the testing probe is brought into contact with the gate line lead 17, the input voltage of the gate line lead 17 is changed, and the current between the source and drain electrodes of the TFT testing pattern is obtained, so as to form a curve of the current change. The electric characteristic of the TFT pattern of the pixel region may be determined according to the current change curve. The following manufacturing processes are performed after performing the above detection of the electric characteristic.

Step 106: forming the pixel electrode and the protection layer by photolithography on the base substrate formed with the above pattern.

This step may deposit a layer of a passivation layer on the base substrate formed with the above pattern by using Plasma Enhanced Chemical Vapor Deposition (PECVD). The passivation layer may use oxide, nitride or oxynitride. The passivation layer is patterned by using an ordinary mask plate, to form a passivation layer via hole which is located above the drain electrode. A transparent conductive thin film is deposited by using magnetic sputtering or heat evaporation methods. The transparent conductive thin film may use indium tin oxide (ITO), indium zinc oxide (IZO) or aluminum zinc oxide and so on, and may also use other metals and metal oxide. A pattern comprising the pixel electrode is formed by patterning process using an ordinary mask plate. The pixel electrode is formed in the pixel region, and is connected with the drain electrode by the passivation layer via hole.

Figure 24:
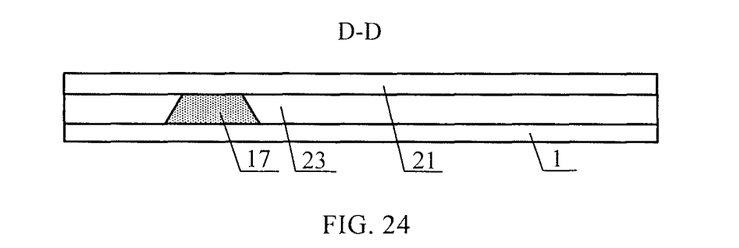
FIG. 24 is a sectional structural diagram after performing the fourth photolithography process to the TFT testing pattern shown in FIG. 22 in the manufacturing method of an array substrate provided by an embodiment of the present disclosure.

FIG. 23 is a sectional structural diagram after performing the fourth photolithography to the TFT testing pattern shown in FIG. 21 in the manufacturing method of an array substrate provided by the embodiment of the present disclosure, and FIG. 24 is a sectional structural diagram after performing the fourth photolithography to the TFT testing pattern shown in FIG. 22 in the manufacturing method of an array substrate provided by the embodiment of the present disclosure. As shown in FIGS. 24 and 25, the step 106 may also be performed as follows: depositing a passivation layer 21 on the base substrate formed by the Step 105 and forming a passivation layer via hole in the pixel region, which is the third photolithography; depositing a transparent electrode layer on the base substrate formed with the above pattern, coating photoresist on the transparent electrode layer, performing exposure and developing to the photoresist using a single-tone mask plate, so as to form a photoresist pattern positioned above the pixel electrode in the pixel region; performing the fourth etching, to form the pattern of the pixel electrode in the pixel region, which is the fourth etching. Thus, the passivation layer 21 is covered the surface of the TFT testing pattern.

So far, the fourth photolithography process is finished in the present embodiment, and the array substrate is formed.

It should be noted that, the present embodiment only gives explanation to one structural form of the formed TFT testing pattern. It can be understood by those skilled in the art that, the TFT testing pattern may also use other structural forms, and the repeated description is omitted here.

The present embodiment only describes by taking the bottom-gate structure TFT as an example. However, those skilled in the art may understand that, the top-gate structure may be accomplished by the following steps: forming a pattern comprising a data line and source/drain electrodes on the pixel region of the base substrate, and at the same time forming patterns of a test line for the data line and of source/drain electrodes of the testing region in the testing region of the base substrate; then depositing a semiconductor thin film and a transparent conductive thin film in the pixel region and the testing region, so as to respectively form patterns comprising a doped semiconductor layer, semiconductor and a pixel electrode in the pixel region and a testing region; and finally depositing a gate insulation layer and a gate metal thin film on the pixel region and the testing region, and forming the gate line in the pixel region by patterning process and forming a gate line and its lead in the testing region, wherein the doped semiconductor layer, the semiconductor layer and the gate insulation layer is covered on the data line of the pixel region and the data line of the testing region and their leads. As to the top-gated structure, the gate insulation layer thin film covering the data line lead may be removed after forming the TFT channel and before forming the passivation layer. The detailed steps may be: by using of the height difference of the photoresist, to remove the doped semiconductor, the semiconductor and the gate insulation layer thin film above the data line lead by using lifting off process, which exhibits simplicity of the process without additionally adding photolithography process. Finally, a layer of a passivation layer may be formed on the base substrate formed with the above pattern. Thus, the passivation layer and the data line lead are directly contacted with each other. The detailed steps may be referred to the forming procedure of the bottom-gate structured TFT similarly, which can be easily deduced by those skilled in the art, so the repeated description is omitted.

During the manufacturing of the array substrate, the present embodiment may perform detection on the electric characteristic of the TFT testing pattern of the testing region after forming the pattern of the TFT channel, instead of performing detection until the accomplishment of the whole array substrate manufacturing procedure. Thus, the present embodiment may obtain the electric characteristic of the TFT pattern of the pixel region timely, so as to repair the production line timely.

The embodiment of the present disclosure further provides an embodiment of an array substrate, and the array substrate comprises a pixel region and a testing region. The pixel region comprises gate lines, data lines and pixel units defined by intersecting between the gate lines and the data lines; and the gate lines and the date lines are provided on different layers, the testing region comprises a testing line lead corresponding to the gate lines or the data lines which are on a lower layers, and the pixel region and the testing region are covered by a passivation layer. No gate insulation layer is retained between the upper portion of the testing line lead of the TFT testing pattern on the testing region. That is, as for the bottom-gated structure, the sectional structure of the TFT in the pixel region or the testing region of the array substrate in the present embodiment is shown in the above FIGS. 23 and 25, that is, the gate line lead makes contact with the passivation layer, which may be manufactured by using the manufacturing process shown in FIG. 1. The structural views of the respective process may be shown as FIGS. 2-25, and the repeated description is omitted here. As for the top-gated structure, the data line lead makes contact with the passivation layer. The accomplishing principle is similar, and the repeated description is omitted here.

The array substrate of the present embodiment may perform detection to the electric characteristic of the TFT testing pattern of the testing region after forming the pattern of the TFT channel, instead of performing the detection until the accomplishment of the whole array substrate manufacturing procedure. Thus, the array substrate of the present embodiment may facilitate the operator to obtain the electric characteristic of the TFT pattern of the pixel region timely, so as to repair the production line timely.

The embodiment of the present disclosure further provides a display device, which comprises the array substrate according to the embodiment of the disclosure. The examples of the display device may comprise liquid crystal display, organic light-emitting display, and electronic paper display.

In an embodiment, a liquid crystal panel is provided, and the liquid crystal panel comprises a color filter substrate and an array substrate cell assembled together, with a liquid crystal layer filled therebetween, wherein the array substrate may adopt the array substrate described by the above embodiments. It can be learned form the manufacturing method of the array substrate and the detailed description of the structure of the array substrate that: during the procedure of manufacturing the array substrate, the liquid crystal panel of the present embodiment may perform detection to the electric characteristic of the TFT testing pattern of the testing region after forming the pattern of the TFT channel, instead of performing the detection until the accomplishment of the whole array substrate manufacturing procedure. Thus, the liquid crystal panel of the present embodiment may facilitate the operator to obtain the electric characteristic of the TFT pattern of the pixel region timely, so as to repair the production line timely.

The embodiment of the present disclosure further provides a method of detecting an array substrate, in which a detection process is performed to the electrical characteristic of the TFT testing pattern after forming TFT testing channel and removing the gate insulation layer thin film above the testing line lead in the TFT testing pattern of the testing region. As to the bottom-gate structure, the testing line lead is the gate line lead; as to the top-gate structure, the testing line is the data line lead.

The detection method of the array substrate of the embodiment of the present disclosure will be described below by taking the bottom-gated structure as an example. Those skilled in the art may understand that the implementing principle is similar for the top-gate structure, and the repeated description is omitted.

The flow of the detecting method of the array substrate provided by the embodiment of the present disclosure may comprise the following steps.

Step 201: making the testing probe into contact with the gate line lead, after forming the TFT testing channel and removing the insulation layer thin film above the gate line lead in the TFT testing pattern of the testing region.

Step 202: changing the input voltage of the gate line lead, to obtain the current change information between the source/drain electrodes of the testing pattern.

Step 203: determining the electric characteristic of the TFT pattern of the pixel region according to the above current change information.

Particularly, in the conventional technology, the process procedure of the manufacturing of the array substrate and the detection of the electric characteristic of the TFT pattern is: firstly forming a gate metal line on the base substrate, then forming a silicon island and source/drain metal lines and TFT channel, then forming a passivation layer and a passivation layer via hole, finally forming a transparent electrode. After the above procedures, i.e., after the accomplishment of the array substrate manufacturing process, the electric characteristic of the formed TFT pattern is tested. In comparison, the embodiment of the present disclosure may perform detection to the electric characteristic of the TFT testing pattern of the testing region after forming the TFT channels of the pixel region and the testing region and before forming the passivation layer, and the subsequent manufacturing processes may be performed after the accomplishment of the detection. Thus, the method of detecting the array substrate of the present embodiment may facilitate the operator to obtain the electric characteristic of the TFT pattern of the pixel region timely, so as to repair the production line timely.

Those with ordinary skills in the art may understand: all steps or portion of the steps of implementing the above method embodiment may be accomplished by a program instructing a related hardware, and the above program may be stored in a readable memory medium of a computer; when the program is implemented, the steps comprising the above method embodiment are performed; the above memory medium comprises various medium which may store the program code such as ROM, RAM, magnetic disk or optic disk, and so on.

It should be explained finally that the above embodiments are only used to explain the technical solution of the disclosed technology, and it is not intended to limit the technical solution of the disclosed technology. Although the disclosed technology is described in detail with reference to the forgoing embodiments, those with ordinary skills in the art should understand: they still may make modifications to the technical solution described by the foregoing embodiments, or make equivalent substitution to some of the technical features. All such modifications or substitutions will not make the nature of the corresponding technical solution depart from the spirit and scope of the technical solution of various embodiments of the disclosed technology.

What is claimed is:

1. A detecting method of an array substrate, comprising detecting the electrical characteristic of the TFT testing pattern after forming a TFT testing channel and removing a gate insulation layer thin film on a data line lead in the TFT testing pattern of the testing region, wherein, detecting the electrical characteristic of the TFT testing pattern comprises:
making a testing probe into contact with the data line lead;

changing the input voltage of the data line lead to obtain the current change information between the source and drain electrodes of the testing region;

determining the electrical characteristic of the TFT testing pattern according to the current change information.

2. A detecting method of an array substrate, comprising detecting an electrical characteristic of a TFT testing pattern after forming a TFT testing channel and removing a gate insulation layer thin film on a testing line lead in the TFT testing pattern of a testing region, wherein, detecting the electrical characteristic of the TFT testing pattern comprises:

making a testing probe into contact with a gate line lead;

changing the input voltage of the gate line lead to obtain the current change information between the source and drain electrodes of the testing region;

determining the electrical characteristic of the TFT testing pattern according to the current change information.

* * * * *